METHOD OF FABRICATING MULTILAYER PRINTED-WIRING BOARDS

Filed Sept. 24, 1962 2 Sheets-Sheet 1

INVENTORS
JOSEPH M. SHAHEEN
HENRY F. JONES

BY A. M. Fernandez

ATTORNEY

INVENTORS
JOSEPH M. SHAHEEN
HENRY F. JONES
BY
A M Fernandez
ATTORNEY 3,311,966

METHOD OF FABRICATING MULTILAYER PRINTED-WIRING BOARDS

Joseph Michael Shaheen and Henry Franklin Jones, Whittier, Calif., assignors to North American Aviation, Inc.

Filed Sept. 24, 1962, Ser. No. 225,754
18 Claims. (Cl. 29—155.5)

Figures 1A, 1B, 1C, 1D, 1E, 1F:
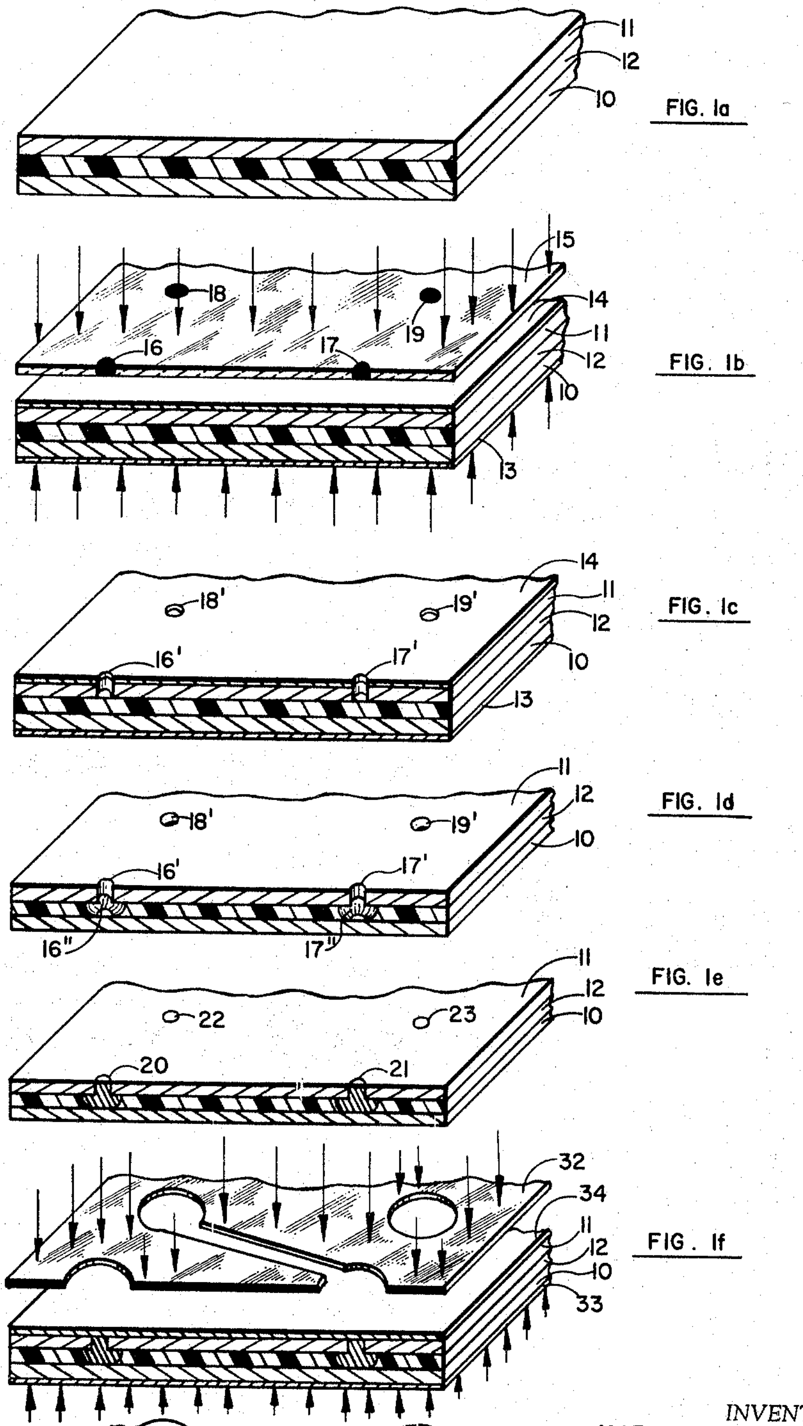

This invention pertains to multilayer printed-wiring boards and to a method of fabricating laminated, multilayer printed-wiring boards.

The development of semiconductor devices has lead to the design and fabrication of subminiature circuits through printed wiring techniques. However, there is a need for even more miniaturization due to the more recent development of solid-state functional circuits formed in crystals of semiconductor material. The effort to provide even more miniaturization has been referred to as microminiaturization, particularly when solid-state functional circuits are being interconnected through printed-wiring boards.

To achieve even greater circuit density through microminiaturization, it is often desirable to have more than one printed-wiring plane since one printed-wiring plane does not allow sufficient freedom in designing the interconnecting wiring for the most compact arrangement of the circuit components or solid-state functional circuits. Some freedom has been achieved through the development of double-sided, printed-wiring boards, both sides of which are interconnected as required through the base or support made of insulating material, such as glass cloth impregnated with epoxy resin. Such a base is frequently referred to hereinafter as a substrate.

When a microminiaturized board requires more than two interconnecting wiring planes to achieve the freedom necessary to design the interconnecting wiring for maximum density of components, as many printed-wiring boards as necessary may be stacked and interconnected, but stacking printed-wiring boards has not been always satisfactory. Some of the problems encountered in stacking wiring boards are first, that the air space required for insulation between boards is often greater in volume than the printed-wiring boards due not only to the dielectric constant of air but also to the physical structure of the electrical connectors provided between the boards and second, that the interconnections themselves often occupy more space than the circuit components or solid-state functional circuits being interconnected.

The use of pins, connecting rods or strips, and other means employed in the past, for spacing and interconnecting stacked printed-wiring boards are unsatisfactory for the further reason that their use does not always yield the freedom sought in designing the interconnecting wiring between the components. For instance, if pins are used between the boards it is not always possible to arbitrarily place a pin at a given interconnecting point due to the mechanical problems of inserting the pin; instead, the pins must generally be placed individually with a maximum density determined by dimensions of the pin itself and dimensions of any tool employed to insert it. A further disadvantage of the prior art pin interconnectors is that the pin must rely on the boards for support so that it is generally necessary to allow the pin to pass through the boards. Connecting rods or strips and other means employed in the past impose similar limitations in designing interconnecting wiring. These and other problems have led to the development of the present invention.

Accordingly, an object of the present invention is to provide an improved method for fabricating multilayer printed-wiring boards.

A further object is to provide an economical method of fabricating multilayer printed-wiring boards without limitations as to the number of printed wiring layers and without limitations as to the number or location of interconnections between layers.

Another object is to provide a multilayer, printed-wiring board having interconnections between layers of wiring placed with such a freedom of design that each layer may be designed completely independent of any other layer, having regard only for the location of points in the preceding layer to which interconnections are to be made.

These and other objects of the invention are achieved by covering both sides of a sheet of insulating material with sheets of conductive material, as for example, by laminating two sheets of copper together with a sheet of epoxy resin impregnated glass cloth. Before etching a pattern of wiring in either sheet of conductive material, a pattern of holes is etched through one sheet at points where interconnections are desired between layers of printed wiring using an acid resist for a mask and a solution which will not dissolve the insulating material, such as ferric chloride ($FeCl_3$) in the example. The hole pattern is then etched through the insulating material with a solution which will not dissolve the conductive material, such as a solution of hydrofluoric and sulfuric acids ($HF-H_2SO_4$) in the present example, using the etched sheet of conductive material as a mask. Finally, before etching a pattern of wiring, redundant interconnections are provided by plating through and filling with a conductive material, such as an alloy of gallium and gold which is plastic at normal room temperatures but which hardens after a short period of time. The wiring pattern is then acid etched in the one sheet using a photo-resist mask.

If the printed-wiring board is to be a double layer or two-sided board, the second interconnecting wiring pattern may be etched in the sheet of conductive material in the other sheet of conductive material while the wiring pattern is being etched in the one sheet; but, if the printed-wiring board is to have three or more layers, the foregoing process is repeated for each layer before the wiring pattern is etched in the other sheet, either while or after the wiring pattern for the last layer is being etched. The process is the same for each layer except that each additional layer is added to a multilayer board by covering the last wiring pattern etched with a sheet of insulating material, covering the insulating material with a sheet of conductive material and laminating the stacked sheets to the board under a relatively low pressure and temperature.

The invention will become more apparent from the following description with reference to the drawings in which:

FIG. 1 pictorially illustrates a flow chart of the basic process for fabricating multilayered printed-wiring boards by depicting a sample in various stages of fabrication; and FIG. 2 pictorially illustrates a flow chart of the repetition of the basic process for additional layers.

Referring to FIG. 1*a*, the step of laminating two sheets of copper 10 and 11 together with a sheet of insulating material 12 is illustrated as the initial step in fabricating a multilayer printed-wiring board.

It should be understood that the drawings are intended to illustrate the method only; accordingly, the dimensions of the sample depicted in the various stages of development are out of proportion. For instance, the thickness of the sheets of copper 10 and 11 may be one mil, while that of the insulating material may be six mils.

Both sides of the laminated board are then cleaned in a solution of hydrochloric acid (HCl) for about fifteen seconds, rinsed in deionized water and coated with films 13 and 14 (FIG. 1*b*) of photosensitive emulsion, such as a bichromated colloid or a resinous ester of maleic anhydride polymer with $\omega$ - hydroxyalkoxy - acetophenones. The emulsion may be deposited by flow techniques and allowed to dry in an oven at 110° C. for about ten minutes. Upon being exposed to ultraviolet light, the photosensitive emulsion hardens to form an acid resist.

The second step depicted in FIG. 1*b* includes photo-exposing the film of emulsion 14 with ultraviolet light for three to five minutes through a positive plate 15 of a pattern of holes 16 to 18 to be etched at points where interconnections between printed-wiring layers are to be provided. At the same time, the film of emulsion 13 on the other side is completely exposed to form a uniform film of acid resist for the etching process of the third step. The exposed emulsion is then developed ten to fifteen minutes in a suitable solvent of unexposed emulsion and rinsed in a solution of methyl ethyl ketone. The laminated board is dried again in an oven at 110° for about ten minutes before etching in the third step.

The third step depicted in the FIG. 1*c* consists of etching the pattern of holes in the sheet of copper 11, such as holes 16' and 17' shown in cross section, with a solution of ferric chloride ($FeCl_3$) which will not dissolve the exposed acid resist or the insulating material of resin-impregnated glass cloth employed to laminate the sheets of copper together. It should be understood that the materials described are illustrative and that other materials may be employed to practice the invention, keeping in mind only that the solution employed for etching the conductive material of the sheets 10 and 11 should not materially dissolve the insulating material 12 and that the solution employed for etching the insulating material in the next step should not materially dissolve the conductive material.

Although other insulating materials are available, until still other or more suitable materials are developed, it is preferred that the insulating material be selected from a class consisting of glass, epoxy resin, polyester, polyurethane, polyethylene terephthalate and combinations thereof, because each may be readily etched with a sulfuric acid solution, except glass, which may readily be etched with a hydrofluoric acid solution, and combinations thereof, which may be readily etched with a combination of sulfuric and hydrofluoric acids in solution. The combination formed by impregnating a cloth of glass fibre with an epoxy resin is more particularly preferred because it is sturdy yet flexible and may be directly employed to laminate sheets of conductive material by the mere application of heat and pressure. The solutions of sulfuric and hydrofluoric acids will not materially etch, or otherwise dissolve, the metallic conductive material in the short time required to etch the insulating material (about fifty seconds for a sheet of epoxy resin impregnated glass cloth about six mils thick), particularly if the sheet of conductive material is selected from a class consisting of copper, silver, gold and any alloy of each. Of that class, copper is preferred because it is readily etched with a ferric chloride acid solution which will not materially etch, or otherwise dissolve, any of the insulating materials of the preferred class.

The next step depicted in FIG. 1*d* is to etch holes through the insulating material 12, such as holes 16'' and 17'' shown in cross section, with a solution of one part by volume of 70% hydrofluoric acid (HF) and two parts of 96% sulfuric acid ($H_2SO_4$). As noted hereinbefore, that solution is selected because it will not dissolve the copper material of the sheets 10 and 11 in the time necessary to etch through the substrate. Accordingly, the sheet of conductive material 11 having a pattern of holes etched through it functions as an acid resist in the fourth step of etching the holes 16'' and 17'' through the insulating material.

It should be noted that the holes 16'' and 17'' etched through the substrate of insulating material 12 are wider at the upper portions thereof. The undercutting beneath the sheet of conductive material 11 in each hole is due to the chemical etching process which tends to proceed at a uniform rate from the center of the corresponding masking holes 16' and 17' in the sheet of conductive material 11. The etching process produces more uniform holes in less time if the solution is agitated ultrasonically at a temperature of 160° F.

The undercut portions of the sheet 11 may be effectively removed by repeating the second and third steps after the fourth step to etch larger holes through the sheet of conductive material 11, the larger holes having a diameter approximately equal to the diameter of the upper portion of the holes 16'' to 19'' etched in the insulating material 12. However, although that may be desirable, it is not deemed to be necessary for the practice of the present invention because the next step is to make electrical interconnections through the etched holes 16'' to 19'' by some suitable method, such as by filling the holes with conductive material, which may be accomplished without removing the undercut portion around each of the holes 16' to 19'. The undercut portions may be etched away without covering the surfaces of the copper sheet 10 exposed by the holes 16''–17'' with an acid resist because the time necessary to etch the undercut portions away is less than the time necessary to etch through the copper sheet 10 due to the greater area exposed for etching through the undercut portions of the sheet 11. Any portion etched from the sheet 10 in the holes 16'' to 17'' may be restored by plating in the next step of the process, but that is not necessary.

After the insulating material 12 has been etched through to the upper surface of the conductive material 10, the laminated board is immersed in a neutralizing solution and rinsed in deionized water before proceeding to the next step ofproviding conductive paths between the sheets 10 and 11 through the holes 16'' to 19'', as by filling the holes with conductive material from the upper surface of the lower sheet of conductive material 10 to the upper surface of the upper sheet of conductive material 11 in a manner depicted in FIG. 1*e* by a solid fill in each hole, such as fills 20 and 21 shown in cross section and fills 22 and 23. Before filling the holes 16'' to 19'', their walls may be electroless plated and then electro plated, preferably with copper. If successful continuity could be reliably achieved by plating through the inside of the holes to provide interconnections, it would not be necessary to completely fill the holes with conductive material. However, for reliability and strength, it is preferred that the holes be completely filled with conductive material, even though successful continuity could be made by first electroless plating and then electroplating through the holes.

Plating through the holes is recommended before filling with conductive material not only to provide redundant electrical paths for greater reliability but also to provide a rough surface for good adhesion of the fill to the exposed part of the sheet 10 (FIG. 1*d*) in the following manner. The walls of the holes 16'' to 19'' and the exposed parts of the plate 10 are first electroless plated, as by a known method of sensitizing with a film of stanous chloride, activating with palladium chloride to reduce the stanous chloride to a film of tin and immersing in a copper sulfate bath. The sulfate is reduced by the film of tin, leaving a film of copper which provides a preliminary conductive path.

After electroless plating, the copper film is oxidized by a suitable agent to form an oxide having a rough surface. An aqueous solution of formaldehyde is then employed to reduce the copper oxide to copper, leaving the rough surface.

The film of copper deposited by an electroless process is very thin and has good adhesion to the porous insulating material only. Accordingly, to thicken the copper film and to secure it more firmly to the copper walls of the holes 16' to 19' in the copper sheet 11, an electroplating process is employed before filling the holes with conductive material. But first the upper surface of the copper sheet 11 is cleaned to remove the electroless plated film, as by abrading, in order that the continuous copper film deposited on the upper surface of the plate 10 and the walls of the holes 16′ to 19′ during the electroplating process will be firmly secured to the copper sheet 10, thereby securing more firmly the electroless plated film in the holes.

The method of completely filling the holes consists of forming an alloy of conductive material that is plastic or liquid at a given temperature and becomes hard at the same temperature. For the purposes of this invention, an alloy may be a substance composed of a metal and a nonmetal, intimately united, such as copper, silver or gold and a resin, but a substance composed of two or more metals is preferred and more particularly preferred is a substance composed of a metal that is liquid at a relatively low temperature, such as gallium, indium or mercury, and a solid metal, such as copper, gold or silver. Specifically preferred is an alloy composed of an eutectic solution of gallium and indium (76% gallium by weight) mixed with gold (65% gold by weight) because it remains liquid or plastic at normal room temperatures for a period of about one hour before hardening and after hardening will remain stable in the solid phase at a temperature considerably higher than room temperature by about 400° to 500° C.

The alloy fill may be applied to the holes by a variety of techniques, as by squeezing if the alloy is plastic. For instance, the specifically preferred alloy of gallium, indium and gold may be squeezed into the holes at room temperature and then allowed to harden at a higher temperature of about 350° F. under a pressure of about 150 p.s.i. The higher temperature and pressure is recommended because if the alloy is too rich in gallium, it will not harden at room temperature, but at higher temperatures, particularly under pressure, the alloy will exude enough droplets of gallium to change the proportion of gallium and thereby enable the remaining mixture to pass into a solid phase.

Another filling method is to form a mixture of powdered indium and gold (50% of each by weight), pour or shake the powdered mixture into the holes, and heat to a temperature above the melting point of indium (155° C.) to allow the alloying process to take place. Upon hardening, the indium-gold alloy will withstand a higher temperature (about 500° C.) as do many other alloys, particularly, gallium alloys.

Still another method is to form spheres using a mixture of powdered metals by metallurgical techniques, each metal having a higher melting temperature than room temperature, such as a mixture of powdered gold, lead and tin. A sphere is placed over each hole and heated. Upon heating, the metal with the lowest melting temperature becomes a liquid and alloying takes place to form an alloy fill with a melting temperature considerably higher than the lowest melting temperatures of the separate metals, and for some alloys, such as indium and gold, higher than the highest melting temperatures of the separate metals.

When an alloy is used to fill the holes, a redundant interconnection is provided through each hole. The first interconnection is provided by the plated copper as described hereinbefore and the second interconnection is provided by the alloy fill. If the specifically preferred alloy, or any alloy of gallium, indium or mercury, is used to fill the holes, the second interconnection in each is made more reliable by the diffusion of the liquid metal into the conductor or connecting pad in the lower printed-wiring layer. The diffusion takes place directly wherever the plating process has failed to provide a film of copper over any exposed surface of the lower connecting pad and through the thin film of plated copper elsewhere by first alloying with the film of plated copper.

When an alloy is used to fill the holes, air pockets in the filled holes may be removed by drawing a vacuum on the printed-wiring board before the alloy hardens. The printed-wiring board may at the same time be placed under a pressure of 150 p.s.i. at 350° F. as just described.

Before proceeding to the next step, it is preferred that the board at that state of fabrication depicted in FIG. 1*e* be electroplated with copper to cover the exposed surfaces of the fills of conductive material, namely interconnections 20 to 23, with a protective film of copper, particularly if the conductive material employed is an alloy of a metal and a nonmetal. The protective film of copper will protect the fills 20 to 23 during subsequent processing for another printed-wiring layer as described with reference to FIG. 2 or for bonding electrical components to them as suggested hereinbefore.

The next step depicted in FIG. 1*f* is to photo-expose the desired wiring pattern on the surface of the sheet of conductive material 11 with a negative 32 after it has been coated with a photo-sensitive emulsion (films 33 and 34) in the same manner as in the second step for etching the pattern of holes. It is standard practice to clean and rinse the surface of the printed circuit board after each etching process; accordingly, after the pattern of holes is etched through the sheet of conductive material 11 in the third step (FIG. 1*c*), the hardened emulsion is removed with a suitable solvent. Therefore, it is necessary to recoat the surfaces of the board in the sixth step with a photosensitive emulsion and to completely expose the bottom film 33 to ultraviolet light when the top film 34 is exposed to the wiring pattern through the negative 32, thereby providing a protective coat for the sheet of conductive material 10 during the next step of etching the wiring pattern.

Figure 1G:
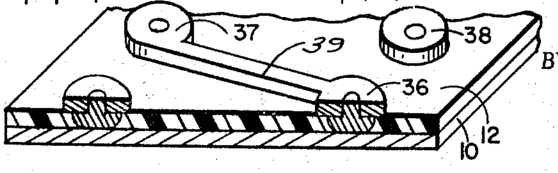

The following step of etching the wiring pattern in the sheet of conductive material 11 is depicted in FIG. 1*g* by the etched wiring pattern comprising two separate connecting pads 35 and 38 and two pads 36 and 37 connected by a strip of conductive material 39. The wiring pattern is separated from the sheet of conductive material 10 by the insulating material 12, but connected thereto by the four interconnections 20 to 23 through the respective pads 35 to 38.

If the printed-wiring board being fabricated is to have only two layers of wiring, the second wiring layer may be etched in the sheet of conductive material 10 as the last step in the process as depicted in the drawing. However, as noted hereinbefore, the second wiring layer may be etched while the wiring pattern 35 to 39 is being etched in the sheet of conductive material 11.

Figure 2A:
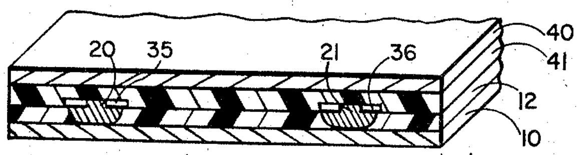
Figure 2B:
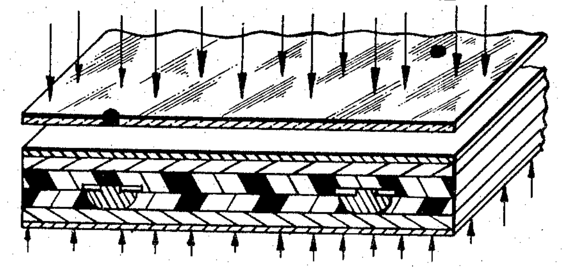
Figure 2C:
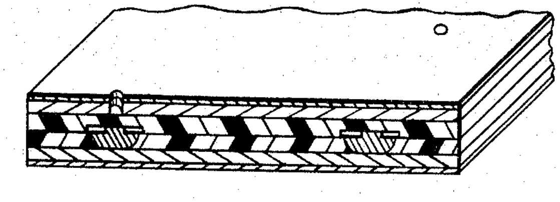
Figure 2D:
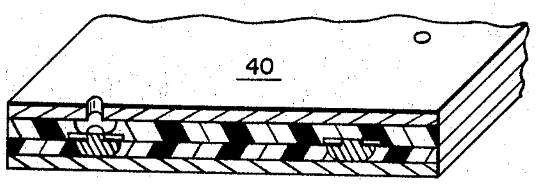
Figure 2E:
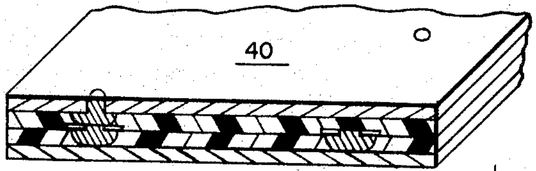
Figure 2F:
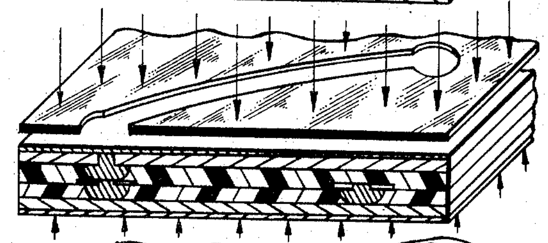
Figure 2G:
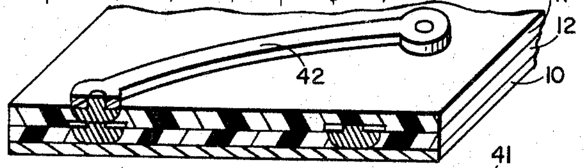
Figure 2H:
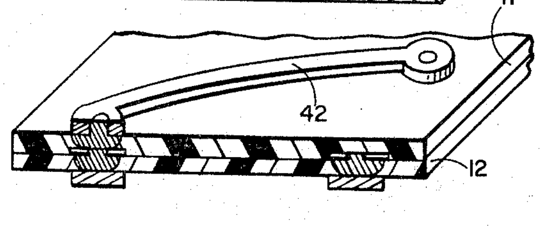

If a third printed-wiring layer is to be interconnected with the printed-wiring board, the first seven steps depicted in FIG. 1 are repeated to laminate a third sheet of conductive material 40 to the printed-wiring board with a sheet of insulating material 41 as depicted in FIG. 2*a*, after which a printed-wiring pattern may be etched on the bottom sheet of conductive material 10, either as a separate step as depicted in FIG. 2*h* or while a third printed-wiring layer 32 (FIG. 2*g*) is being etched in the third sheet of conductive material 40.

The steps of the process for providing the third printed-wiring layer are repeated in FIGS. 2*a* to 2*g* for clarity, beginning with the first step of laminating the sheet of conductive material 40 to the printed-wiring board with the sheet of insulating material 41. It should be noted that during the laminating process, the insulating material is compressed between the connecting pads, such as the pads 35 and 36, of the last printed-wiring layer and the sheet of conductive material 40. However, the thickness of about 4 to 8 mils selected for the insulating material is sufficient to provide the requisite insulation between a connecting pad of about 1 mil thickness and the sheet of conductive material 40 where interconnections are not desired. The proportions employed in the drawings are not to scale.

The remaining steps for the third printed-wiring layer are the same as the steps employed to develop the second printed-wiring layer etched in the sheet of conductive material 11. The specific steps depicted in FIGS. 2*a* to 2*g* for processing the third layer of conductive material 40 into the printed wiring pattern 42 may be repeated for as many additional layers as desired.

The foregoing method of fabricating multilayer printed-wiring boards may be employed to microminiaturize interconnecting wiring almost without limit. The only limits are those imposed by the techniques currently available for the various steps. Techniques for copper etching have been developed to a high degree and the technique of acid etching through the substrate using an etched copper sheet as a mask makes it possible to simultaneously etch a large number of holes. The holes etched through the copper may be about .015 inch in diameter and the etched copper connecting pad surrounding the filled interconnecting holes may be .030 inch so that interconnections may be placed at a minimum distance almost as small as .030 inch center to center. The undercut referred to with reference to FIG. 1*d* will not impose a limit on this minimum distance if the thickness of the insulating material does not exceed one half the distance of the diameter of the hole etched through the copper sheet, or .0075 inch for .015 inch holes, because the diameter of the undercut has been found to be equal to $2T+D$ where T is the thickness of the insulating material and D is the diameter of the holes etched through the copper sheet. For example, if the thickness of insulating material is selected to be .006 inch, the diameter of the undercut is .027 inch so that the undercut is not a limitation on the minimum distance between interconnections since connecting pads of a diameter of .030 inch is desirable for connecting components or interconnections to other layers. The copper sheets may be about .001 inch thick, providing a total thickness for a two sided board of .008 inch. If greater rigidity is desired than is provided by a board .008 inch thick, a substrate .05 inch thick may be laminated on one side. However, that is not necessary in multilayer boards since rigidity of the board is increased with the addition of each layer.

While particular examples of the invention have been described, it should be understood that the invention is not limited thereto since many modifications may be made in the materials, proportions, temperatures, pressures and times of each step, as well as the processes employed to carry out each step. Accordingly, the terms of the appended claims are not to be limited to the particular examples and processes of each step, but to the true spirit and scope of the invention.

What is claimed is:

1. A method of fabricating a printed wiring board having first and second interconnected wiring patterns separated by a substrate of electrically insulating material which comprises laminating first and second sheets of electrically conductive material to opposite sides of a substrate of insulating material, producing a pattern of holes through said first sheet and said substrate at points where electrical interconnections between said first and second wiring patterns are desired, providing a conductive path through each of said holes from the inner surface of said second sheet to the outer surface of said first sheet of conductive material to form the desired electrical interconnections, etching said first wiring pattern on said first sheet of conductive material, said first wiring pattern including said desired electrical interconnections, and etching said second wiring pattern on said second sheet of conductive material, said second wiring pattern including pads of conductive material the inner surfaces of which are connected to said desired electrical interconnections.

2. A method of fabricating a printed-wiring board having first and second interconnected wiring patterns separated by a substrate of electrically insulating material as defined in claim 1 wherein the step of providing an electrically conductive path through each of said holes comprises providing two redundant electrical interconnections, the first by plating the inside of each hole with a thin film of conductive material and the second by filling each hole with a plastic conductive alloy.

3. A method of fabricating a two-sided printed-wiring board with interconnections through a substrate which comprises laminating first and second sheets of electrically conductive material to opposite sides of a substrate of electrically insulating material, depositing a first coat of photo-sensitive emulsion on both sheets of conductive material and photo-exposing said first coat of emulsion on said first sheet through a positive of a pattern of desired holes for interconnections and completely photo-exposing said first coat of emulsion on said second sheet, thereby hardening the emulsion around said pattern of holes desired in said first sheet and hardening the emulsion on the second sheet, removing the unexposed emulsion with a suitable solvent and etching said pattern of desired holes through said first sheet of conductive material with a first etching solution which will not materially dissolve the hardened emulsion and said substrate of insulating material, etching said pattern of desired holes through said substrate of insulating material to said second sheet of conductive material with a second etching solution which will not materially dissolve the conductive material, thereby using said first sheet of conductive material having the etched pattern of holes as a mask, forming electrical interconnections between said first and second sheets of electrically conductive material through holes etched from the outer surface of said first sheet to the inner surface of said second sheet, removing the exposed emulsion and depositing a second coat of photo-sensitive emulsion on the outer surface of said first sheet, including holes having electrical interconnections formed therein, and the outer surface of said second sheet, and exposing said second coat of emulsion on said first and second sheets to a source of light through negatives of desired wiring patterns, thereby hardening the exposed emulsion around the desired wiring patterns, and removing the unexposed emulsion with a suitable solvent and etching said desired wiring patterns on said first and second sheets with said first etching solution.

4. A method of fabricating a multilayer printed-wiring board which comprises laminating first and second sheets of electrically conductive material to a first substrate of electrically insulating material to form a double-clad, blank wiring board, depositing a first coat of photo-sensitive emulsion on the outer surfaces of said first and second sheets of conductive material, photo-exposing said first coat of emulsion on said first sheet through a positive of a desired pattern of interconnecting holes where interconnections between superimposed wiring patterns are desired and completely photo-exposing the first coat of emulsion on said second sheet, thereby hardening the emulsion around said desired pattern of holes in said first sheet and the emulsion on the second sheet, removing the unexposed emulsion with a suitable solvent and etching said desired pattern of holes through the conductive material of said first sheet to the insulating material of said first substrate with a first etching solution which will not materially dissolve the hardened photo-sensitive emulsion and said first substrate, etching said desired pattern of holes through said first substrate to the conductive material of said second sheet, using the conductive material of said first sheet having the pattern of etched holes as a mask with a second etching solution which will not materially dissolve the conductive material of said first and second sheets, forming electrical interconnections between said first and second sheets of conductive material through holes etched from the outer surface of said first sheet to the inner surface of said second sheet, removing the exposed emulsion and depositing a second coat of photo-sensitive emulsion on the outer surface of said first sheet, including holes having electrical interconnections formed therein, and the outer surface of said second sheet, and photo-exposing said second coat on the outer surface of said first sheet through a negative of a first printed-wiring pattern desired and completely photo-exposing said second coat on the outer surface of said second sheet, thereby hardening the exposed emulsion around the desired printed-wiring pattern on said first sheet, removing the unexposed emulsion with a suitable solvent and etching said first wiring pattern in said first sheet of conductive material with said first etching solution, laminating a third sheet of conductive material to the first substrate over said first etched wiring pattern, including filled holes, with a second substrate of insulating material, thereby forming a double substrate with said first printed-wiring pattern embedded therebetween, depositing a third coat of photo-sensitive emulsion on the outer surfaces of said second and third sheets of conductive material, and exposing said third coat of emulsion to a source of light through a positive of a desired pattern of holes for interconnections through the second substrate to said first printed-wiring pattern embedded between said first and second substrates, continuing the process for said third sheet of conductive material and said second substrate of insulating material as for the second sheet and said first substrate of insulating material until a second pattern of wiring has been etched thereon, repeating the process for each additional printed-wiring pattern as for said second pattern of wiring etched on said third sheet until the desired number of superimposed printed-wiring patterns have been formed with interconnections between wiring patterns as desired, and etching a printed-wiring pattern on said second sheet of conductive material.

5. A method of fabricating a printed-wiring board having first and second interconnected wiring patterns separated by a substrate of electrically insulating material which comprises laminating first and second sheets of electrically conductive material to opposite sides of a substrate of insulating material, etching a pattern of holes through said first sheet at points where desired interconnections between first and second wiring patterns are desired with a first etching solution which will not materially dissolve the insulating material of said substrate, etching said pattern of holes through the insulating material of said substrate to said second sheet of conductive material with a second etching solution which will not materially dissolve the conductive material, using the conductive material of said first sheet having an etched pattern of holes as a mask, filling the etched holes with electrically conductive material from the inner surface of said second sheet to the outer surface of said first sheet of conductive material to form said desired electrical interconnections, etching said first wiring pattern on said first sheet of conductive material, said first wiring pattern including said desired electrical interconnections, and etching said second wiring pattern on said second sheet of conductive material, said second wiring pattern including pads of conductive material the inner surfaces of which are connected to said desired electrical interconnections.

6. A method of fabricating a printed-wiring board as defined in claim 5 wherein said electrically insulating material is selected from the class consisting of glass, epoxy resin, polyester, polyurethane, polyethylene terephthalate and combinations thereof, and said second etching solution is selected from a class consisting of solutions of sulfuric and hydrofluoric acids, and combined solutions thereof, according to the insulating material selected, hydrofluoric acid being an etcher for glass and sulfuric acid being an etcher for the other insulating materials of the class defined.

7. A method of fabricating a printed-wiring board as defined in claim 5 wherein said electrically insulating material comprises a glass cloth impregnated with epoxy resin and said second etching solution comprises a combination of sulfuric and hydrofluoric acids in solution.

8. A method of fabricating a printed-wiring board as defined in claim 7 wherein said sheets of electrically conductive material are made of copper and said first etching solution comprises a solution of ferric chloride.

9. A method of fabricating a two-sided printed-wiring board with interconnections through a substrate which comprises laminating first and second sheets of electrically conductive material to opposite sides of a substrate of electrically insulating material, depositing a first coat of photo-sensitive emulsion on both sheets of conductive material and photo-exposing said first coat of emulsion on said first sheet through a positive of a pattern of desired holes for interconnections and completely photo-exposing said first coat of emulsion on said second sheet, thereby hardening the emulsion around said pattern of holes desired in said first sheet and hardening the emulsion on the second sheet, removing the unexposed with a suitable solvent and etching said pattern of desired holes through said first sheet of conductive material with a first etching solution which will not materially dissolve the hardened emulsion and said substrate of insulating material, etching said pattern of desired holes through said substrate of insulating material to said second sheet of conductive material with a second etching solution which will not materially dissolve the conductive material, thereby using said first sheet of conductive material having the etched pattern of holes as a mask, forming electrical interconnections between said first and second sheets of electrically conductive material by filling the etched holes with conductive material from the inner surface of said second sheet to the outer surface of said first sheet, removing the exposed emulsion and depositing a second coat of photosensitive emulsion on the outer surface of said first and second sheets, and exposing said second coat of emulsion on said first and second sheets to a source of light through negatives of desired wiring patterns, thereby hardening the exposed emulsion around the desired wiring patterns, and removing the unexposed emulsion with a suitable solvent and etching said desired wiring patterns on said first and second sheets with said first etching solution.

10. A method of fabricating a printed-wiring board as defined in claim 9 wherein said electrically insulating material is selected from the class consisting of glass, epoxy resin, polyester, polyurethane, polyethylene terephthalate and combinations thereof, and said second etching solution is selected from a class consisting of solutions of sulfuric and hydrofluoric acids, and combined solutions thereof, according to the insulating material selected, hydrofluoric acid being an etcher for glass and sulfuric acid being an etcher for the other insulating materials of the class defined.

11. A method of fabricating a printed-wiring board as defined in claim 9 wherein said electrically insulating material comprises a glass cloth impregnated with epoxy resin, said second etching solution comprises a combination of sulfuric and hydrofluoric acids in solution, said sheets of electrically conductive material are made of copper and said first etching solution comprises a solution of ferric chloride.

12. A method of fabricating a printed-wiring board as defined in claim 9 wherein the step of forming electrical interconnections between said first and second sheets of electrically conductive material by filling etched holes with conductive material comprises providing two redundant electrical interconnections through each etched hole, the first by plating the inside of each hole with a thin film of electrically conductive metal and the second by filling each plated hole with a plastic electrically conductive alloy.

13. A method of fabricating a printed-wiring board as defined in claim 12 wherein said plastic electrically conductive alloy is an alloy of at least two metals which is plastic at a given temperature and which becomes a solid solution at said given temperature after alloying, whereby the second redundant electrical interconnection through each plated hole is formed by said alloy which diffuses into said second sheet of electrically conductive material directly at any unplated areas thereof and indirectly elsewhere by alloying through said thin film of plated conductive metal.

14. A method of fabricating a multilayer printed-wiring board which comprises laminating first and second sheets of electrically conductive material to a first substrate of electrically insulating material to form a double-clad, blank wiring board, depositing a first coat of photo-sensitive emulsion on the outer surfaces of said first and second sheets of conductive material, photo-exposing said first coat of emulsion on said first sheet through a positive of a desired pattern of interconnecting holes where interconnections between superimposed wiring patterns are desired and completely photo-exposing the first coat of emulsion on said second sheet, thereby hardening the emulsion around said desired pattern of holes in said first sheet and the emulsion on the second sheet, removing the unexposed emulsion with a suitable solvent and etching said desired pattern of holes through the conductive material of said first sheet to the insulating material of said first substrate with a first etching solution which will not materially dissolve the hardened photo-sensitive emulsion and said first substrate, etching said desired pattern of holes through said first substrate to the conductive material of said second sheet, using the conductive material of said first sheet having the etched pattern of holes as a mask with a second etching solution which will not materially dissolve the conductive material of said first and second sheets, forming electrical interconnections between said first and second sheets of conductive material by filling the etched holes with electrically conductive material from the inner surface of said second sheet to the outer surface of said first sheet, removing the exposed emulsion and depositing a second coat of photo-sensitive emulsion on the outer surface of said first sheet, including filled holes, and the outer surface of said second sheet, and photo-exposing said second coat on the outer surface of said first sheet through a negative of a first printed-wiring pattern and completely photo-exposing said second coat on the outer surface of said second sheet, thereby hardening the exposed emulsion around the desired printed-wiring pattern on said first sheet, removing the unexposed emulsion with a suitable solvent and etching said first wiring pattern in said first sheet of conductive material with said first etching solution, removing the exposed emulsion and laminating a third sheet of conductive material to the first substrate over said first etched wiring pattern including filled holes, with a second substrate of insulating material, thereby forming a double substrate with said first printed-wiring pattern embedded therebetween, depositing a third coat of photo-sensitive emulsion on the outer surfaces of said second and third sheets of conductive material, and exposing said third coat of emulsion to a source of light through a positive of a desired pattern of holes for interconnections through the second substrate to said first printed-wiring pattern embedded between said first and second substrates, continuing the process for said third sheet of conductive material and said second substrate of insulating material as for the second sheet and said first substrate of insulating material until a second pattern of wiring has been etched thereon, repeating the process for each additional printed-wiring pattern as for said second pattern of wiring etched on said third sheet until the desired number of superimposed printed-wiring patterns have been formed with interconnections between wiring patterns as desired, and etching a printed-wiring pattern on said second sheet of conductive material.

15. A method of fabricating a printed-wiring board as defined in claim 14 wherein said electrically insulating material is selected from the class consisting of glass, epoxy resin, polyester, polyurethane, polyethylene terephthalate and combinations thereof, and said second etching solution is selected from a class consisting of solutions of sulfuric and hydrofluoric acids, and combined solutions thereof, according to the insulating material selected, hydrofluoric acid being an etcher for glass and sulfuric acid being an etcher for the other insulating materials of the class defined.

16. A method of fabricating a printed-wiring board as defined in claim 15 wherein said electrically insulating material comprises a glass cloth impregnated with epoxy resin, said second etching solution comprises a combination of sulfuric and hydrofluoric acids in solution, said sheets of electrically conductive material are made of copper and said first etching solution comprises a solution of ferric chloride.

17. A method of fabricating a printed-wiring board as defined in claim 15 wherein the steps of forming electrical interconnections between adjacent patterns of printed-wiring through holes in a substrate of insulating material comprises providing two redundant electrical interconnections through each hole, the first by plating the inside of each of said holes with a thin film of conductive material and the second by filling each of the plated holes with a plastic conductive alloy comprising a solution of a liquid metal and a solid metal at a given temperature in such a proportion that the alloy forms a solid solution at said given temperature, said liquid metal diffusing into the conductive material of the printed-wiring pattern to which interconnections are being made.

18. A method of fabricating a multilayer printed-circuit board comprising providing a board consisting of a sheet of electrically insulating substrate material covered on each side with a sheet of conductive material, forming a pattern of desired holes through at least one of said sheets of conductive material and said substrate material, depositing conductive material on surfaces of said board, thereby to electrically interconnect said sheets of conductive material through said holes, removing portions of a sheet of conductive material on at least one side of said board in a desired pattern to leave a first layer of conductive circuits, including conductive pads around holes and at points where electrical connections to subsequent circuit layers are desired through a second sheet of insulating substrate material, applying said second sheet of insulating substrate material to said first layer of conductive circuits and a third sheet of conductive material on said second sheet of insulating substrate material, forming a pattern of desired holes through said third sheet of conductive material and said second sheet of insulating substrate material to expose conductive pads of said first layer of conductive circuits where electrical connections to said first layer of conductive circuits are desired through said second sheet of insulating material, depositing conductive material on surfaces of said board, thereby to electrically interconnect said third sheet of conductive material to said first layer of conductive circuits through holes formed through said second sheet of insulating material, removing portions of said third sheet of conductive material in a desired pattern to leave a second layer of conductive circuits, including conductive pads around said holes and conductive pads at points where electrical connections are to be made, and sequentially fabricating additional layers of conductive circuits, each connected to a preceding layer at desired points, in the same manner as said second layer of conductive circuits.

References Cited by the Examiner

UNITED STATES PATENTS

| | | | |
|---|---|---|---|
| 2,864,156 | 12/1958 | Cardy | 29—155.5 |
| 2,909,833 | 10/1959 | Murray et al. | 29—155.5 |
| 3,053,929 | 9/1962 | Friedman | 174—68.5 |
| 3,077,511 | 2/1963 | Bohrer et al. | 174—68.5 |
| 3,169,892 | 2/1965 | Lemelson. | |
| 3,217,209 | 11/1965 | Kinsella et al. | |
| 3,219,749 | 11/1965 | Schuster et al. | |
| 3,228,093 | 1/1966 | Bratton. | |

JOHN F. CAMPBELL, *Primary Examiner.*

JOHN P. WILDMAN, *Examiner.*

W. B. FREDRICKS, R. W. CHURCH, *Assistant Examiners.*